United States Patent
Horiuchi et al.

(10) Patent No.: US 10,840,037 B1
(45) Date of Patent: Nov. 17, 2020

(54) KEYBOARD DEVICE

(71) Applicant: Chicony Electronics Co., Ltd., New Taipei (TW)

(72) Inventors: Mitsuo Horiuchi, New Taipei (TW); Chia-Hsin Chen, New Taipei (TW); Po-Hsin Li, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/740,034

(22) Filed: Jan. 10, 2020

Related U.S. Application Data

(60) Provisional application No. 62/863,428, filed on Jun. 19, 2019.

(30) Foreign Application Priority Data

Aug. 20, 2019 (TW) .............................. 108129708 A

(51) Int. Cl.
*H01H 13/7065* (2006.01)

(52) U.S. Cl.
CPC ... *H01H 13/7065* (2013.01); *H01H 2231/002* (2013.01)

(58) Field of Classification Search
CPC ......... H01H 13/7065; H01H 2231/002; H01H 3/125; H01H 13/70; H01H 13/702; H01H 13/704; H01H 13/705; G06F 3/0202; F16B 21/02; F16M 2200/08; F16M 11/041

USPC ......... 200/5 A, 341–345, 512–517; 400/490, 400/491, 491.2

See application file for complete search history.

(56) References Cited

U.S. PATENT DOCUMENTS

| | | | | |
|---|---|---|---|---|
| 6,140,595 | A * | 10/2000 | Yao ........................ | H01H 3/125 200/341 |
| 6,225,586 | B1 * | 5/2001 | Watanabe .............. | H01H 3/125 200/344 |
| 8,759,698 | B2 * | 6/2014 | Chiba .................... | H01H 3/125 200/310 |
| 2020/0273642 | A1 * | 8/2020 | Yen ....................... | H01H 13/705 |

\* cited by examiner

*Primary Examiner* — Edwin A. Leon
*Assistant Examiner* — Lheiren Mae A Caroc
(74) *Attorney, Agent, or Firm* — Muncy, Geissler, Olds & Lowe, P.C.

(57) ABSTRACT

A keyboard includes a substrate, a limit connecting member, a keycap, and a liftable connecting member. The assembly area of the substrate includes a long fixation hole having two short sides, a first long side, and a second long side. A portion of the bottom surface of the substrate is further recessed to form a long bottom groove, and two ends of the long bottom groove are near to the two short sides. The limit connecting member is disposed on the assembly area and includes a fixed seat in the long fixation hole and a standing portion extending from the fixed seat. The fixed seat includes a lower wing plate correspondingly fixed in the long bottom groove. The keycap is disposed on the assembly area. The liftable connecting member is connected between the keycap and the assembly area and includes a shaft disposed on the limit connecting member.

10 Claims, 9 Drawing Sheets

KEYBOARD DEVICE

CROSS-REFERENCES TO RELATED APPLICATIONS

This application claims the priority benefit of U.S. provisional application Ser. No. 62/863,428, filed on Jun. 19, 2019 and Patent Application No. 108129708 filed in Taiwan, R.O.C. on Aug. 20, 2019. The entirety of the above-mentioned patent applications are hereby incorporated by references herein and made a part of the specification.

BACKGROUND

Technical Field

The instant disclosure relates to an input device, in particular, to a keyboard device.

Related Art

Keyboards are common input devices. Usually, they are used along with daily computer products (such as laptops, notebook computers, smart phones, or tablets) or industrial scaled control equipment or processing equipment.

In general, a keyboard known to the inventor(s) has a substrate and several keycaps disposed on the substrate. Generally, a connecting member (such as a scissor connecting member) is disposed between each of the keycaps and the substrate. Hence, when the keycap is pressed, the keycap can be guided by the connecting member to perform an up-and-down movement relative to the substrate.

SUMMARY

However, the connecting member is a one-piece hook structure assembled on the substrate and formed by integrally bending the substrate. In response to the "thin and light" trend in manufacturing the substrate, the structural strength of the hook structure is also reduced. As a result, upon being forced, the hook structure may be deformed easily or even broken.

In view of this, in one embodiment, a keyboard device is provided. The keyboard comprises a substrate, a limit connecting member, a keycap, and a liftable connecting member. The substrate has a top surface and a bottom surface opposite to the top surface. The top surface comprises an assembly area, and the assembly area comprises a long fixation hole. The long fixation hole is defined through the top surface and the bottom surface. The long fixation hole has two short sides, a first long side, and a second long side. The two short sides are opposite to each other. The first long side is connected between the two short sides, and the second long side is connected between the two short sides. A portion of the bottom surface adjacently connected to the first long side is further recessed to form a long bottom groove, and two ends of the long bottom groove are near to the two short sides of the long fixation hole. The limit connecting member is disposed on the assembly area. The limit connecting member comprises a fixed seat and a standing portion. The fixed seat is received and fixed in the long fixation hole. The standing portion is extending from the fixed seat and protruding from the top surface. One side of the fixed seat opposite to the standing portion further comprises a lower wing plate. The lower wing plate is correspondingly fixed in the long bottom groove. The keycap is disposed on the assembly area of the substrate. The liftable connecting member is connected between the keycap and the assembly area. The liftable connecting member comprises a shaft disposed on the limit connecting member.

Based on the above, in the keyboard device according to the one or some embodiments of the instant disclosure, the bottom surface of the substrate comprises the long bottom groove, the two ends of the long bottom groove are respectively near to the two short sides of the long fixation hole, and the fixed seat of the limit connecting member comprises the lower wing plate for corresponding fixed in the long bottom groove. Hence, the engaging area of the limit connecting member in the extension direction of the long fixation hole can be greatly increased, thereby improving the positioning performance and the drawing force of the limit connecting member, and preventing the limit connecting member from detaching off the substrate when the limit connecting member is forced to rotate.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
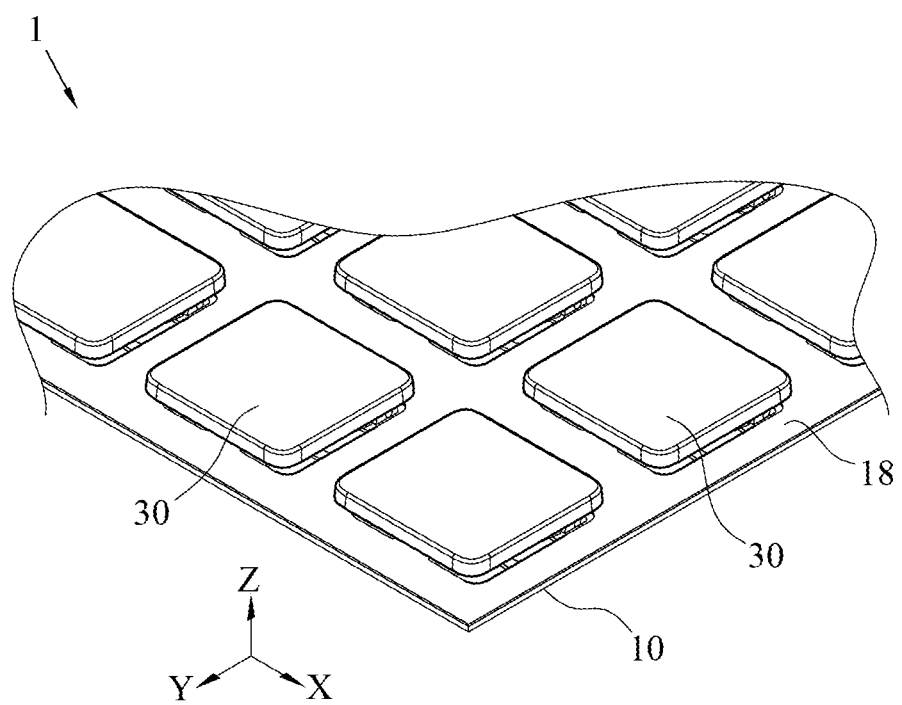
FIG. 1 illustrates a partial perspective view of a keyboard device according to an exemplary embodiment of the instant disclosure.
Figure 2:
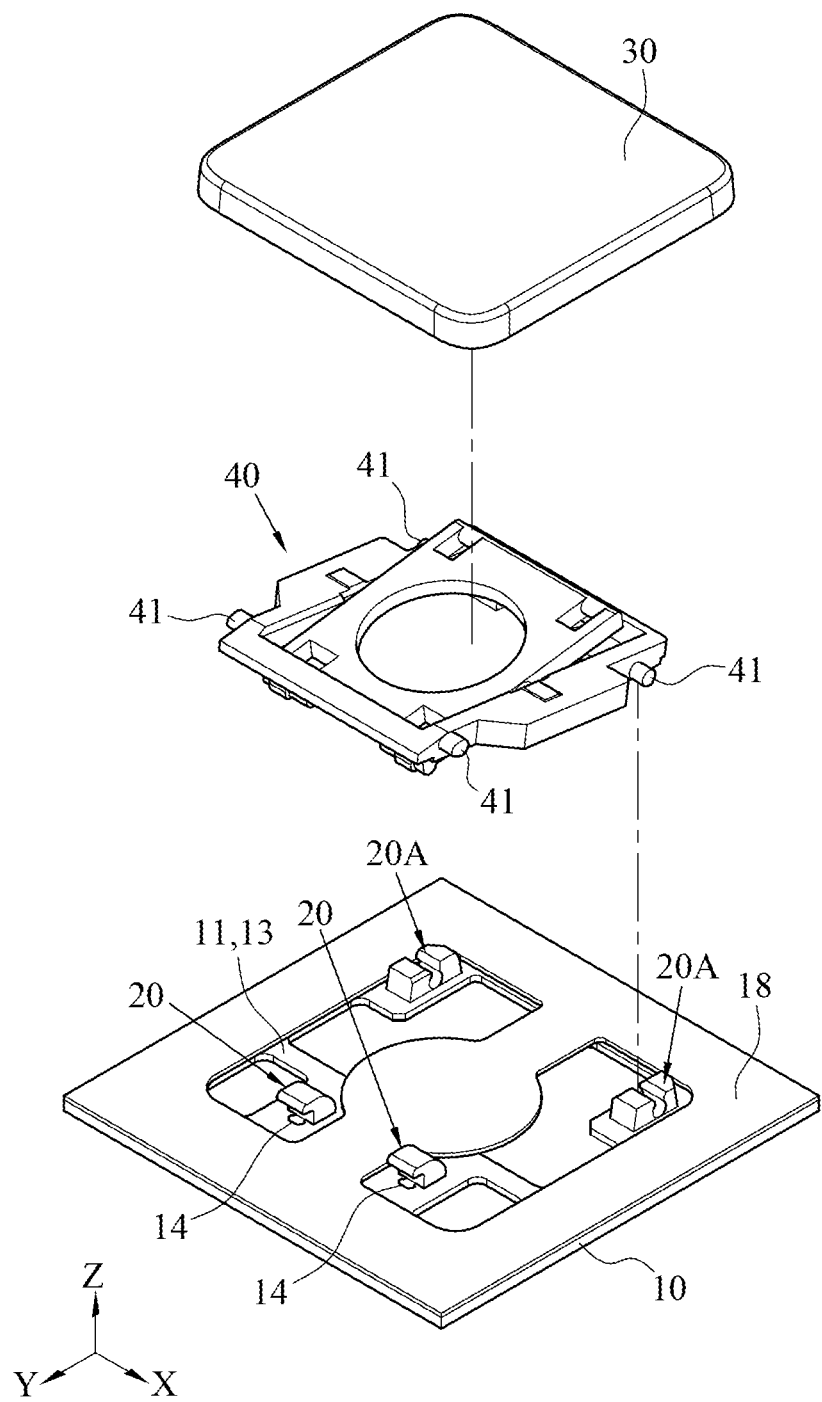
FIG. 2 illustrates a partial exploded view of a keyboard device according to an exemplary embodiment of the instant disclosure.
Figure 3:
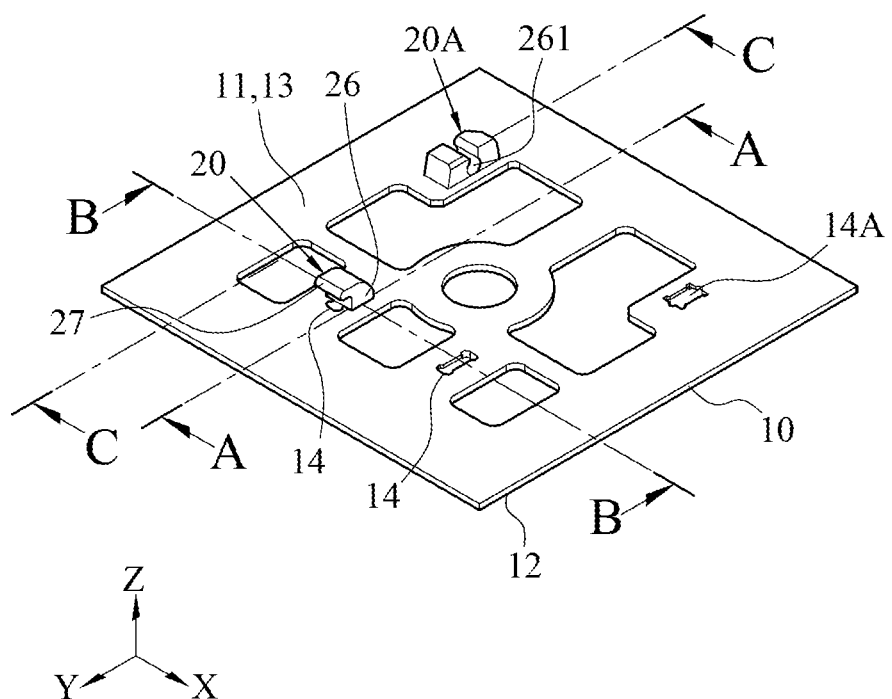
FIG. 3 illustrates a perspective view showing a substrate and a limit connecting member of a keyboard device according to an exemplary embodiment of the instant disclosure.

Embodiments are provided for facilitating the descriptions of the instant disclosure. However, the embodiments are provided as examples for illustrative purpose, but not a limitation to the instant disclosure. In all the figures, same reference numbers designate identical or similar elements. FIG. 1 illustrates a partial perspective view of a keyboard device 1 according to an exemplary embodiment of the instant disclosure. FIG. 2 illustrates a partial exploded view of a keyboard device 1 according to an exemplary embodiment of the instant disclosure. FIG. 3 illustrates a perspective view showing a substrate 10 and a limit connecting member 20 of a keyboard device 1 according to an exemplary embodiment of the instant disclosure. As shown in FIGS. 1 to 3, in this embodiment, the keyboard device 1 comprises a substrate 10, a plurality of limit connecting members 20, a plurality of keycaps 30, and a plurality of liftable connecting members 40. The keyboard device 1 may be utilized in different electronic devices (e.g., laptops, notebooks, or input devices of other electronic devices), and users can operate the keyboard device 1 to generate corresponding signal(s).

As shown in FIGS. 1 and 2, for example, the keyboard device 1 may be a computer keyboard, and a membrane circuit board 18 may be disposed on the substrate 10. The keycaps 30 may comprise, for example, a plurality of alphabet keys, a plurality of number keys, a space key, an enter key, and a caps lock key. The keycaps 30 are disposed and arranged on the membrane circuit board 18. Each of the liftable connecting members 40 is connected between the substrate 10 and the corresponding keycap 30 for guiding the corresponding keycap 30 to perform an up-and-down movement (as shown in FIG. 2, in this embodiment, one keycap 30 and one liftable connecting member 40 are presented for illustrative purposes). When the keycap 30 is pressed, the keycap 30 is moved toward the membrane circuit board 18 downwardly to trigger a signal; conversely, when the keycap 30 is released, the keycap 30 is moved upwardly to a position where the keycap 30 is not pressed.

As shown in FIGS. 1 to 3, the substrate 10 may be a rigid plate made of metal (e.g., iron, aluminum, alloy, etc.), or plastic material. The substrate 10 has a top surface 11 and a bottom surface 12 opposite to the top surface 11, and the top surface 11 comprises a plurality of assembly areas 13. The assembly area 13 is an area for assembling the keycap 30 on the substrate 10 (for example, an area of the substrate 10 exposed from the membrane circuit board 18 as shown in FIG. 2).

As shown in FIGS. 2 and 3, in this embodiment, each of the assembly areas 13 of the substrate 10 comprises a plurality of long fixation holes (in this embodiment, two long fixation holes 14 and two long fixation holes 14A). The two long fixation holes 14 are provided for fixing two limit connecting members 20 on the substrate 10, and the two long fixation holes 14A are provided for fixing two limit connecting members 20A on the substrate 10. The liftable connecting member 40 comprises a plurality of shafts 41 for disposing on the limit connecting members 20, 20A. Specifically, in this embodiment, the liftable connecting member 40 is a scissor connecting member, but embodiments are not limited thereto.

In some embodiments, the limit connecting members 20 may be fixed in the long fixation holes 14 and the limit connecting members 20A may be fixed in the long fixation holes 14A respectively by a manner of insert molding; alternatively, the limit connecting members may be fixed in the long fixation holes respectively by a manner of injection molding, but embodiments are not limited thereto. According to one or some embodiments of the instant disclosure, the limit connecting member 20, 20A is integrally formed as a one-piece structure and the structural strength of the limit connecting member 20, 20A can be greatly improved. Moreover, as compared with the hook formed by bending the substrate known to the inventor(s), since the limit connecting member 20, 20A according to one or some embodiments of the instant disclosure is an independent component (with respect to the substrate 10), the structural strength of the limit connecting member 20, 20A is not affected when the thickness of the substrate 10 is reduced. Consequently, the keyboard device 1 can achieve the "thin and light" trend.

Figure 4:
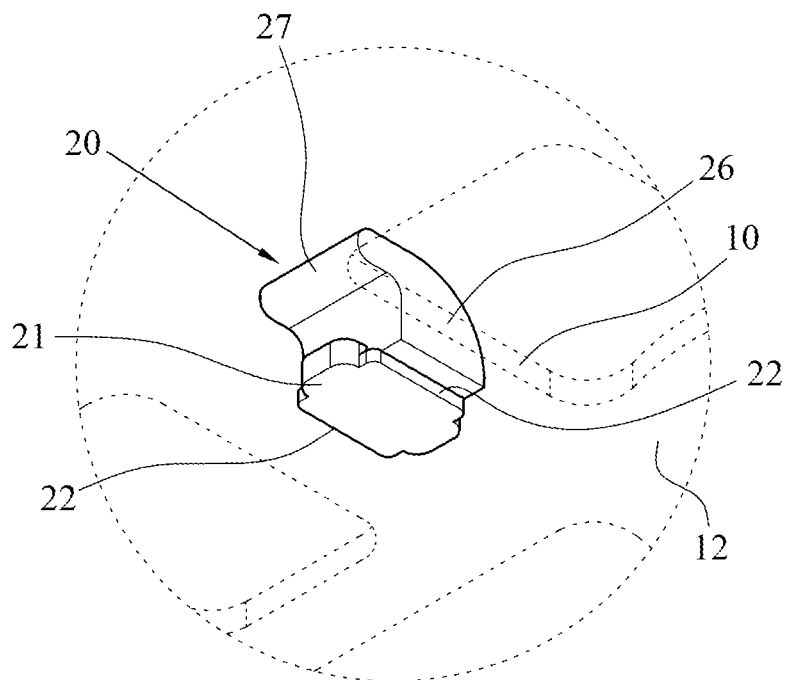
FIG. 4 illustrates a partial bottom view of the limit connecting member shown in FIG. 3.
Figure 5:
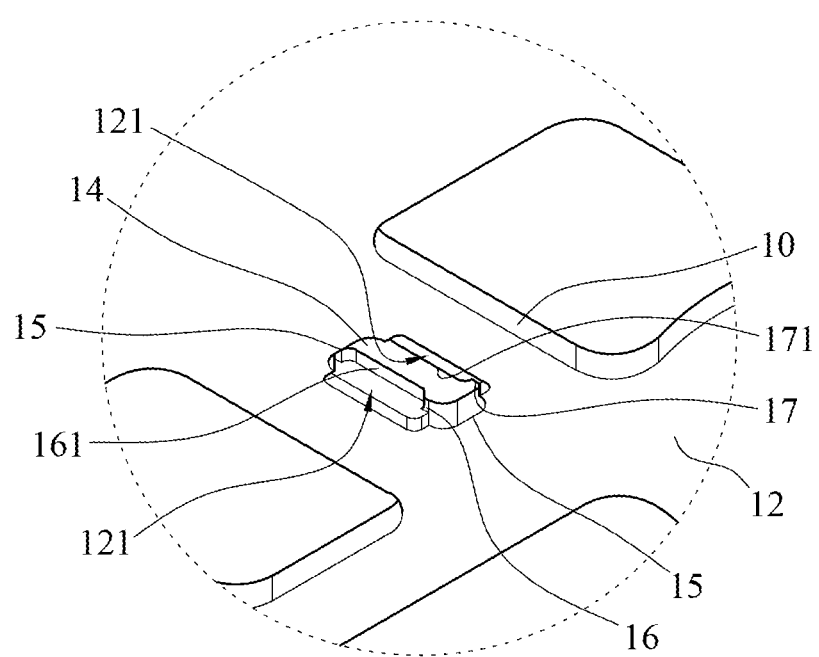
FIG. 5 illustrates a partial bottom view of a long fixation hole of the substrate shown in FIG. 3.

Please refer to FIGS. 2 to 5. In FIG. 3, one limit connecting member 20 is omitted for clearly presenting the position and the shape of the long fixation holes 14, 14A. FIG. 4 and FIG. 5 respectively illustrate a partial bottom view of the limit connecting member 20 shown in FIG. 3 and a partial bottom view of the long fixation hole 14 shown in FIG. 3. Moreover, in FIG. 4, the substrate 10 is omitted for clearly presenting the actual shape of the limit connecting member 20. In this embodiment, the long fixation hole 14 is defined through the top surface 11 and the bottom surface 12 of the substrate 10, and the long fixation hole 14 has a first long side 16, a second long side 17, and two opposite short sides 15. The first long side 16 and the second long side 17 are respectively connected between the two short sides 15. In other words, the long fixation hole 14 is an elongated hole extending toward one direction (as shown in FIG. 3, in this embodiment, the long fixation hole 14 is extending toward the Y axis direction and approximately formed as a rectangular hole). Therefore, a length of the first long side 16 is greater than a length of each of the short sides 15, and a length of the second long side 17 is also greater than the length of each of the short sides 15.

As shown in FIGS. 4 and 5, portions of the bottom surface 12 of the substrate 10 adjacently connected to the first long side 16 and the second long side 17 are further recessed to form two long bottom grooves 121. Two ends of each of the long bottom grooves 121 are respectively near to the two short sides 15 of the long fixation hole 14. In other words, each of the long bottom grooves 121 is an elongated groove. Moreover, in one embodiment, a length of each of the long bottom grooves 121 is greater than half of a length of the first long side 16, so that the two ends of each of the long bottom grooves 121 are respectively near to the two short sides 15. For example, supposed that the length of the first long side 16 is 1 cm, the length of each of the long bottom grooves 121 may be 0.6 cm, 0.8 cm, or 0.9 cm. Alternatively, in another embodiment, the two ends of each of the long bottom grooves 121 may be extending toward the two short sides 15 of the long fixation hole 14. Therefore, the length of each of the long bottom grooves 121 is equal to the length of the first long side 16.

Further, as shown in FIGS. 4 and 5, in this embodiment, each of the limit connecting members 20 is disposed on the corresponding assembly area 13 of the substrate 10. Each of the limit connecting members 20 comprises a fixed seat 21 and a standing portion 26. The fixed seat 21 is received and fixed in long fixation hole 14, and the standing portion 26 is upwardly extending from the fixed seat 21 and protruding from the top surface 11 of the substrate 10. One side of the fixed seat 21 opposite to the standing portion 26 further comprises two lower wing plates 22, and the two lower wing plates 22 are correspondingly fixed in the two long bottom grooves 121. For example, each of the limit connecting members 20 may be fixed in the corresponding long fixation hole 20 in an insert molding manner or in an injection molding manner. Therefore, the fixed seat 21 has a shape corresponding to the long fixation hole 14. Hence, the fixed seat 21 is received in the long fixation hole 14, and the two lower wing plates 22 are held in and fixed in the two long bottom grooves 121.

Figure 6:
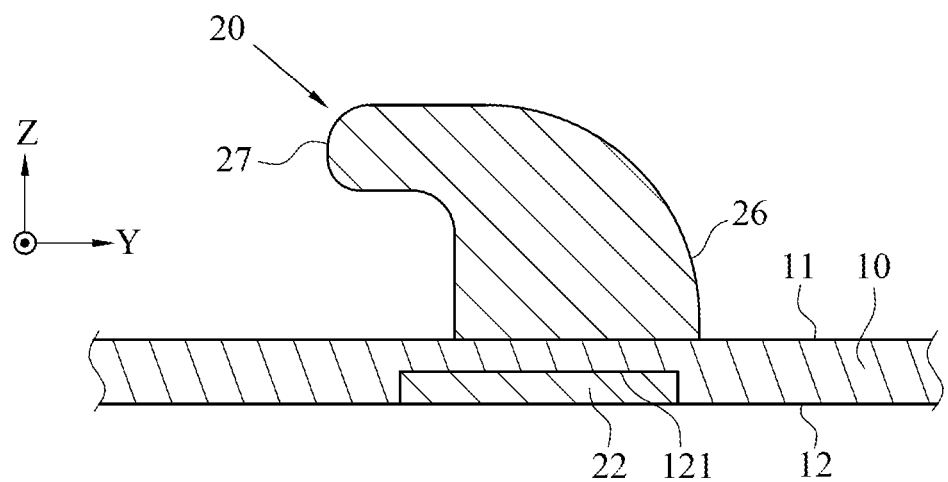
FIG. 6 illustrates a cross-sectional view of the limit connecting member shown in FIG. 3.
Figure 7:
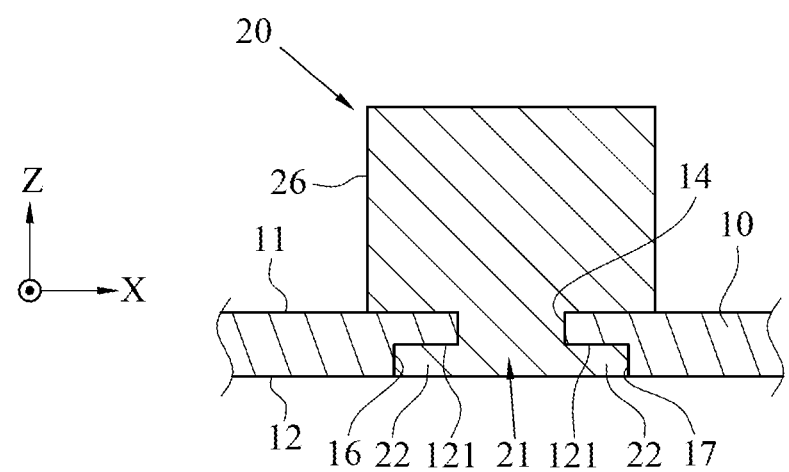
FIG. 7 illustrates another cross-sectional view of the limit connecting member shown in FIG. 3.

Please further refer to FIGS. 2, 3, 6, and 7. FIG. 6 illustrates a cross-sectional view of the limit connecting member 20 along the line A-A shown in FIG. 3 (as shown in FIG. 3, in this embodiment, the limit connecting member 20 is sectioned along the Y axis direction). FIG. 7 illustrates a cross-sectional view of the limit connecting member 20 along the line B-B shown in FIG. 3 (as shown in FIG. 3, in this embodiment, the limit connecting member 20 is sectioned along the X axis direction). In this embodiment, a hook portion 27 is laterally extending from a top end of the standing portion 26 of each of the limit connecting member 20, the hook portion 27 extends along a direction parallel to the first long side 16 (as shown in FIGS. 3 and 6, in this embodiment, the hook portion 27 extends along the Y axis direction). The shaft 41 of the liftable connecting member 40 may be disposed at a bottom portion of the hook portion 27. Moreover, when each of the keycaps 30 is pressed to have an up-and-down movement relative to the substrate 10, the keycap 30 drives the liftable connecting member 40 to move, so that the shaft 41 is moved in the extension direction of the hook portion 27.

As above, according to one or some embodiments of the instant disclosure, the bottom surface 12 of the substrate 10 comprises the long bottom groove 121, and the two ends of the long bottom groove 121 are respectively near to the two short sides 15 of the long fixation hole 14. Hence, the engaging area of the lower wing plate 22 of the limit connecting member 20 in the extension direction of the long fixation hole 14 can be greatly increased. As shown in FIG. 6, the engaging area between each of the long bottom grooves 121 and the corresponding lower wing plate 22 of the fixed base 21 of each of the limit connecting members 20 can be greatly increased in the Y axis direction (that is, the extension direction of the long fixation hole 14, the first long side 16, and the hook portion 27). Hence, the positioning performance of the limit connecting member 20 can be enhanced, and the drawing force of the limit connecting member 20 can be improved. Moreover, the increased engaging area can prevent the limit connecting member 20 from detaching off the long fixation hole 14 of the substrate 10 when the limit connecting member 20 is forced to rotate (e.g., when the hook portion 27 is pulled by the upward force of the liftable connecting member 40).

In some embodiments, as shown in FIG. 5, the long bottom groove 121 may be processed to form thin flanges 161, 171. Specifically, in some embodiments, portions of the bottom surface 12 of the substrate 10 adjacently connected to the first long side 16 and the second long side 17 are stamped or flattened, so that the portions being pressed are inwardly extending to the long fixation hole 14, and the thin flanges 161, 171 inwardly protruding to the long fixation hole 14 are respectively formed on the first long side 16 and the second long side 17. Hence, the engaging area between each of the lower wing plates 22 and the corresponding long bottom groove 121 are further increased, thereby further improving the positioning performance and the drawing force of the limit connecting member 20. Moreover, under such configuration, the top surface 11 of the substrate 10 does not form bump structures and can be a flat plane.

Figure 8:
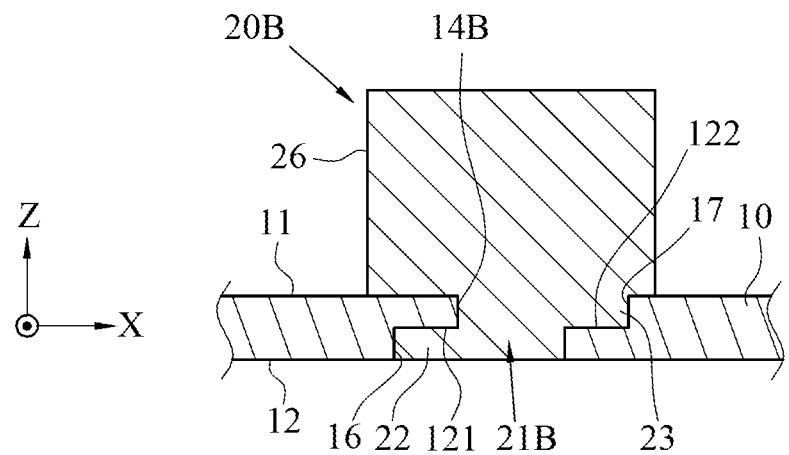
FIG. 8 illustrates a cross-sectional view of a limit connecting member of a keyboard device according to another exemplary embodiment of the instant disclosure.

Please refer to FIG. 8. FIG. 8 illustrates a cross-sectional view of a limit connecting member 20B of a keyboard device 1 according to another exemplary embodiment of the instant disclosure. Same as the embodiment(s) shown in FIGS. 4 to 7, in this embodiment, a portion of the bottom surface 12 of the substrate 10 adjacently connected to the first long side 16 of the long fixation hole 14B is also recessed to form the long bottom grooves 121, and the fixed seat 21B of each of the limit connecting members 20 also comprises the lower wing plate 22 correspondingly fixed in the long bottom groove 121. On the other hand, the difference between the embodiment(s) shown in FIGS. 4 to 7 and this embodiment is at least that, in this embodiment, a portion of the bottom surface 12 of the substrate 10 adjacently connected to the second long side 17 does not form the long bottom groove 121; in this embodiment, a portion of the top surface 11 of the substrate 10 adjacently connected to the second long side 17 is recessed to form a long top groove 122. The long top groove 122 is also an elongated groove. In one embodiment, a length of the long top groove 122 is greater than half of a length of the second long side 17 or is equal to the length of the second long side 17. Moreover, in this embodiment, the fixed seat 21B of the limit connecting member 20B further comprises an upper wing plate 23 corresponding to the long top groove 122, and the upper wing plate 23 is correspondingly fixed in the long top groove 122. Accordingly, the engaging area between the upper wing plate 23 and the long upper groove 122 in the extension direction of the long fixation hole 14B are further increased, thereby further improving the positioning performance and the drawing force of the limit connecting member 20B. Moreover, the increased engaging area can prevent the limit connecting member 20B from being rotated to detach off the long fixation hole 14B.

Figure 9:
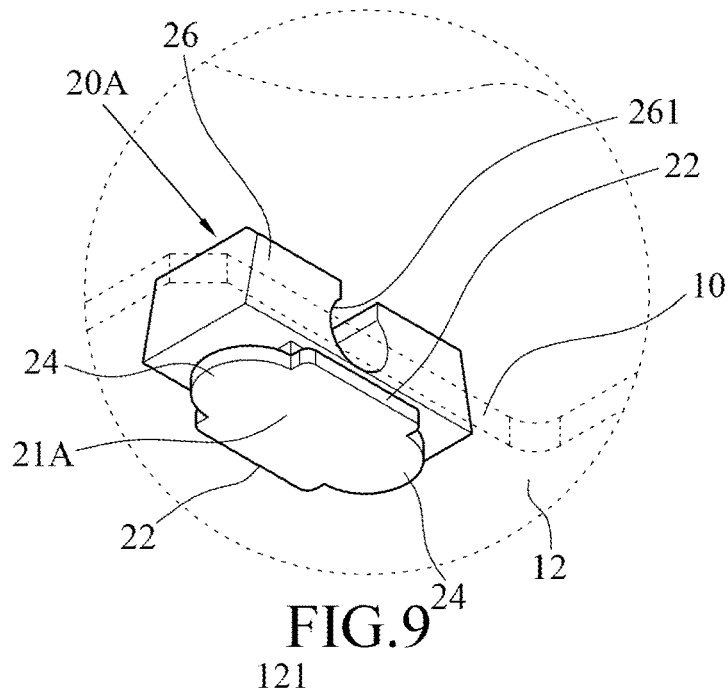
FIG. 9 illustrates a partial bottom view of another limit connecting member shown in FIG. 3.
Figure 10:
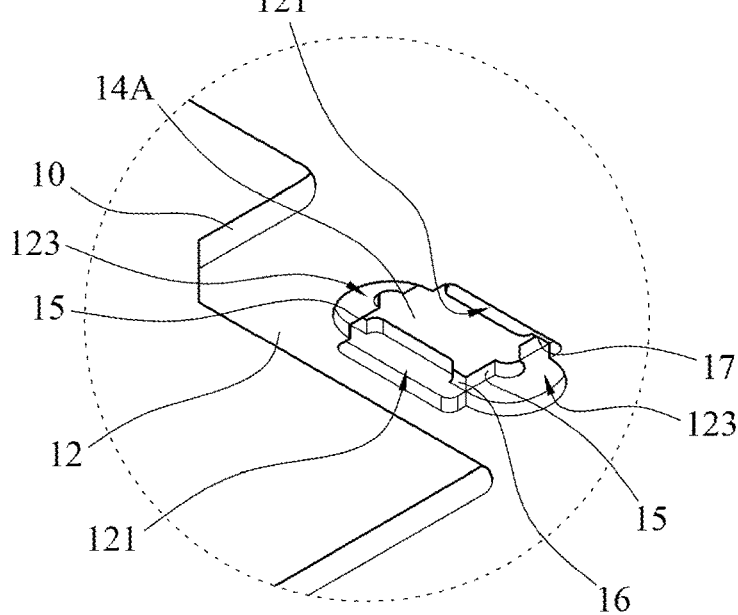
FIG. 10 illustrates a partial bottom view of another long fixation hole shown in FIG. 3.
Figure 11:
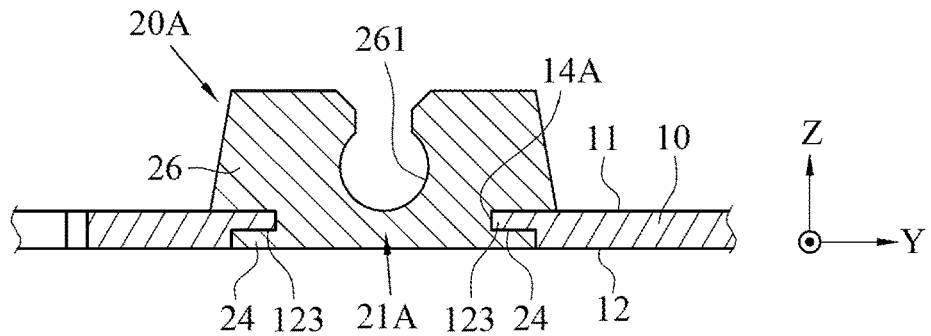
FIG. 11 illustrates a cross-sectional view of another limit connecting member shown in FIG. 3.

Please refer to FIGS. 9, 10, and 11. FIGS. 9 and 10 respectively illustrate partial bottom views of the limit connecting member 20A and the long fixation hole 14A shown in FIG. 3. In FIG. 9, the substrate 10 is omitted for clearly presenting the actual shape of the limit connecting member 20A. FIG. 11 illustrates a cross-sectional view of the limit connecting member 20A along the line C-C shown in FIG. 3 (as shown in FIG. 3, in this embodiment, the limit connecting member 20A is sectioned along the Y axis direction). Same as the embodiment(s) shown in FIGS. 4 to 7, in this embodiment, portions of the bottom surface 12 of the substrate 10 adjacently connected to the first long side 16 and the second long side 17 of the long fixation hole 14A are recessed to form two long bottom grooves 121, and the fixed seat 21A of each of the limit connecting members 20 comprises two lower wing plates 22 correspondingly fixed in the two long bottom grooves 121. On the other hand, the difference between the embodiment(s) shown in FIGS. 4 to 7 and this embodiment is at least that, in this embodiment, portions of the bottom surface 12 of the substrate 10 adjacently connected to the two short sides 15 of the long fixation hole 14A further are recessed to form two short bottom grooves 123, and the fixed seat 21A of the limit connecting member 20A further comprises two protruding plates 24, and the two protruding plates 24 are correspondingly fixed in the two short bottom grooves 123. In this embodiment, the protruding plate 24 and the short bottom groove 123 may be of a semicircle to correspond to each other, but embodiments are not limited thereto. In some embodiments, the protruding plate 24 and the short bottom groove 123 may be of other shapes (e.g., square or oval shape) corresponding to each other. Hence, according to one or some embodiments of the instant disclosure, the two short sides 15 of the long fixation hole 14A further comprise the short bottom grooves 123 for engaging with the two protruding plates 24 of the limit connecting member 20A, thereby further improving the positioning performance and the drawing force of the limit connecting member 20A.

Moreover, as shown in FIG. 11, a portion of the fixed seat 21A of the limit connecting member 20A near to the two ends of the two short sides 15 of the long fixation hole 14A can be held and fixed, thereby further effectively preventing the limit connecting member 20A from being rotated when the limit connecting member 20A is forced.

Further, as shown in FIGS. 3, 9, 10, and 11, in this embodiment, the standing portion 26 of each of the limit connecting members 20A does not have the hook portion 27; conversely, in this embodiment, the standing portion 26 comprises a shaft hole 261 for correspondingly disposing a portion of the shaft 41 of the liftable connecting member 40. In this embodiment, an axial direction of the shaft hole 261 of each of the limit connecting members 20A (as shown in FIG. 3, in this embodiment, the axial direction of each of the limit connecting members 20A is the X axis direction) is perpendicular to the first long side 16, but embodiments are not limited thereto. In some embodiments, the structure of each of the limit connecting members 20A may be the same as the structure of each of the limit connecting structures 20.

Figure 12:
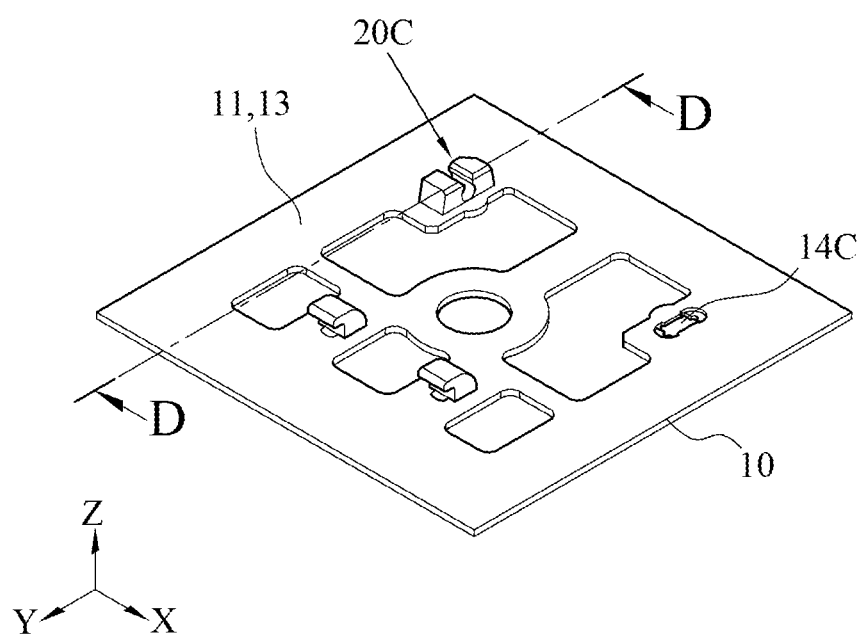
FIG. 12 illustrates a perspective view of a substrate and the limit connecting member of the keyboard device of another exemplary embodiment.
Figure 13:
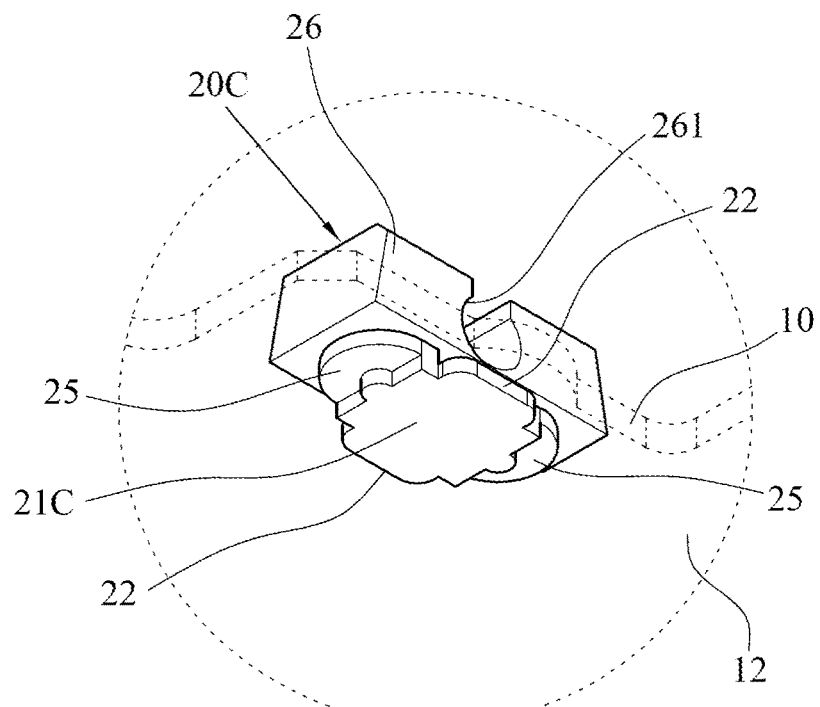
FIG. 13 illustrates a partial bottom view of the limit connecting member shown in FIG. 12.
Figure 14:
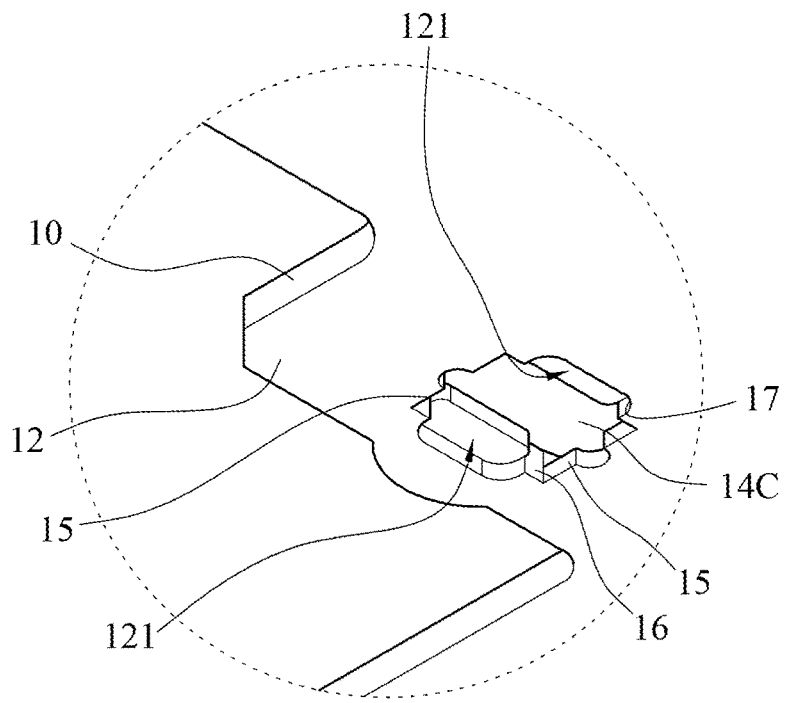
FIG. 14 illustrates a partial bottom view of a long fixation hole of the substrate shown in FIG. 12.
Figure 15:
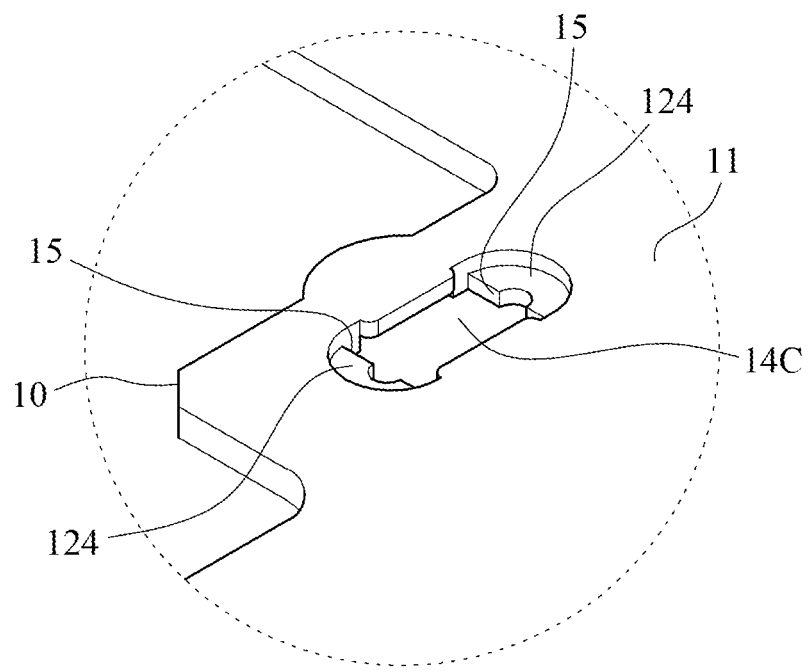
FIG. 15 illustrates a partial top view of the long fixation hole of the substrate shown in FIG. 12.
Figure 16:
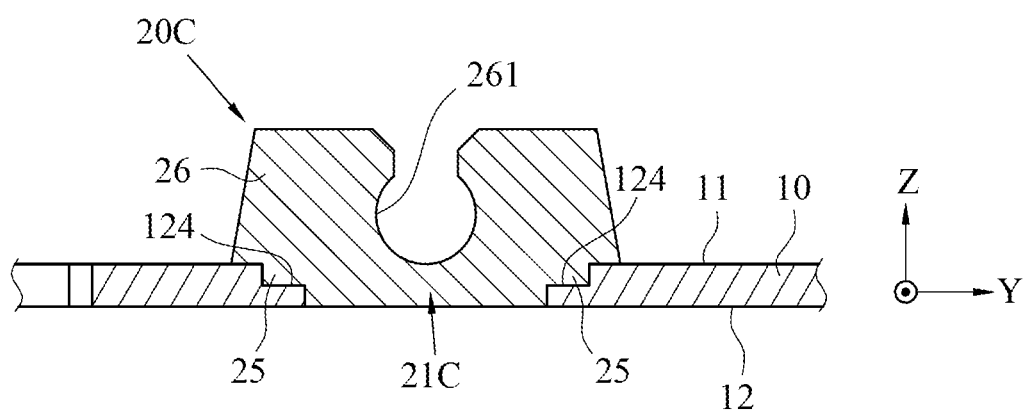
FIG. 16 illustrates a cross-sectional view of the limit connecting member shown in FIG. 12.

As shown in FIGS. 12 to 15, the substrate 10 and limit connecting member 20C of a keyboard device 1 according another embodiment of the instant disclosure are illustrated. In this embodiment, the assembly area 13 of the substrate 10 comprises at least one long fixation hole 14C for disposing the shaft 41 of the limit connecting member 40. In FIG. 12, one limit connecting member 20C is omitted for clearly presenting the position and the shape of the long fixation hole 14C. FIGS. 13 and 14 respectively illustrate partial bottom views of the limit connecting member 20C and the long fixation hole 14C shown in FIG. 12. FIG. 15 illustrates a partial top view of the long fixation hole 14C shown in FIG. 12. FIG. 16 illustrates a cross-sectional view along line D-D shown in FIG. 12 (as shown in FIG. 12, in this embodiment, the limit connecting member 20C is sectioned along the Y axis direction). Same as the embodiment(s) shown in FIGS. 9 to 11, in this embodiment, portions of the bottom surface 12 of the substrate 10 adjacently connected to the first long side 16 and the second long side 17 of the long fixation hole 14C are also recessed to form two long bottom grooves 121, and the fixed seat 21C of each of the limit connecting members 20C also comprises two lower wing plates 22 for corresponding fixed in the two long bottom grooves 121.

As shown in FIGS. 12 to 15, the difference between the embodiment(s) shown in FIGS. 9 to 11 and this embodiment is at least that, in this embodiment, portions of the substrate 10 adjacently connected to the two short sides 15 of the long fixation hole 14C do not are recessed to form two short bottom grooves 123; in this embodiment, portions of the top surface 11 of the substrate 10 adjacently connected to the two short sides 15 are recessed to form two short top grooves 124 (as shown in FIG. 15), and the fixed seat 21C of the limit connecting member 20C further comprises two protruding plates 25 correspondingly fixed in the two short top grooves 124. In this embodiment, the protruding plate 25 and the short top groove 124 may be of a semicircle to correspond to each other, but embodiments are not limited thereto. In some embodiments, the protruding plate 25 and the short top groove 124 may be of other shapes (e.g., square or oval shape) corresponding to each other.

Hence, according to one or some embodiments of the instant disclosure, the two short sides 15 of the long fixation hole 14C further comprise the short top grooves 124 for engaging with the two protruding plates 25 of the limit connecting member 20C, thereby further improving the positioning performance and the drawing force of the limit connecting member 20C. Moreover, as shown in FIG. 16, portions of the fixed seat 21C of the limit connecting member 20C near to the two ends of the two short sides 15 of the long fixation hole 14C can be held and fixed, thereby further effectively preventing the limit connecting member 20C from being rotated when the limit connecting member 20C is forced.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard device comprising:
  a substrate having a top surface and a bottom surface opposite to the top surface, wherein the top surface comprises an assembly area, the assembly area comprises a long fixation hole, the long fixation hole is defined through the top surface and the bottom surface, and the long fixation hole has two short sides, a first long side, and a second long side, the two short sides are opposite to each other, the first long side is connected between the two short sides, and the second long side is connected between the two short sides; wherein a portion of the bottom surface adjacently connected to the first long side is further recessed to form a long bottom groove, and two ends of the long bottom groove are near to the two short sides of the long fixation hole;
  a limit connecting member disposed on the assembly area, wherein the limit connecting member comprises a fixed seat and a standing portion, the fixed seat is received and fixed in the long fixation hole, the standing portion is extending from the fixed seat and protruding from the top surface; one side of the fixed seat opposite to the standing portion further comprises a lower wing plate, and the lower wing plate is correspondingly fixed in the long bottom groove;
  a keycap disposed on the assembly area of the substrate; and
  a liftable connecting member connected between the keycap and the assembly area, wherein the liftable connecting member comprises a shaft disposed on the limit connecting member.

2. The keyboard device according to claim 1, wherein a length of the long bottom groove is greater than half of a length of the first long side.

3. The keyboard device according to claim 1, wherein the two ends of the long bottom groove further extend to the two short sides of the long fixation hole.

4. The keyboard device according to claim 1, wherein the first long side further comprises a thin flange protruding toward the long fixation hole.

5. The keyboard device according to claim 1, wherein a portion of the bottom surface adjacently connected to the second long side is further recessed to form a second long bottom groove, and one side of the fixed seat opposite to the lower wing plate further comprises a second lower wing plate, the second lower wing plate is correspondingly fixed in the second long bottom groove.

6. The keyboard device according to claim 1, wherein a portion of the top surface adjacently connected to the second long side is further recessed to form a long top groove; the fixed seat further comprises an upper wing plate, and the upper wing plate is correspondingly fixed in the long top groove.

7. The keyboard device according to claim 1, wherein portions of the bottom surface adjacently connected to the two short sides are further recessed to form two short bottom grooves; the fixed seat further comprises two protruding plates, and the two protruding plates are correspondingly fixed in the two short bottom grooves.

8. The keyboard device according to claim 1, wherein portions of the top surface adjacently connected to the two short sides are further recessed to form two short top grooves; the fixed seat further comprises two protruding plates, and the two protruding plates are correspondingly fixed in the two short top grooves.

9. The keyboard device according to claim 1, wherein a hook portion is laterally extending from a top end of the standing portion, the hook portion extends along an extension direction, and the extension direction is parallel to the first long side.

10. The keyboard device according to claim 1, wherein the standing portion comprises a shaft hole, an axial direction of the shaft hole is perpendicular to the first long side.

* * * * *